United States Patent
Wu et al.

(10) Patent No.: US 10,425,186 B2
(45) Date of Patent: Sep. 24, 2019

(54) COMBINED CODING DESIGN FOR EFFICIENT CODEBLOCK EXTENSION

(71) Applicant: MediaTek Inc., Hsinchu (TW)

(72) Inventors: Wei-De Wu, Hsinchu (TW); Mao-Ching Chiu, Chiayi County (TW)

(73) Assignee: MEDIATEK INC., Hsinchu (TW)

( * ) Notice: Subject to any disclaimer, the term of this patent is extended or adjusted under 35 U.S.C. 154(b) by 46 days.

(21) Appl. No.: 15/701,431

(22) Filed: Sep. 11, 2017

(65) Prior Publication Data

US 2018/0076923 A1    Mar. 15, 2018

Related U.S. Application Data

(60) Provisional application No. 62/393,262, filed on Sep. 12, 2016.

(51) Int. Cl.
| | |
|---|---|
| *H04L 1/00* | (2006.01) |
| *H03M 13/29* | (2006.01) |
| *H03M 13/39* | (2006.01) |
| *H03M 13/09* | (2006.01) |
| *H03M 13/13* | (2006.01) |

(52) U.S. Cl.
CPC .......... *H04L 1/0013* (2013.01); *H03M 13/09* (2013.01); *H03M 13/13* (2013.01); *H03M 13/29* (2013.01); *H03M 13/2906* (2013.01); *H03M 13/3961* (2013.01); *H04L 1/004* (2013.01); *H04L 1/0041* (2013.01); *H04L 1/0045* (2013.01); *H04L 1/0061* (2013.01); *H04L 1/0065* (2013.01)

(58) Field of Classification Search
CPC .. H04L 1/0013; H04L 1/004; H03M 13/3961; H03M 13/29
See application file for complete search history.

(56) References Cited

U.S. PATENT DOCUMENTS

| | | | |
|---|---|---|---|
| 2013/0117344 A1* | 5/2013 | Gross | G06F 17/10 708/490 |
| 2014/0040214 A1 | 2/2014 | Ma | |
| 2014/0169388 A1 | 6/2014 | Jeong et al. | |
| 2015/0333775 A1 | 11/2015 | Korb et al. | |
| 2016/0241258 A1* | 8/2016 | Zeng | H03M 13/13 |
| 2017/0047947 A1* | 2/2017 | Hong | H03M 13/2906 |
| 2017/0244429 A1* | 8/2017 | Hof | H03M 13/2924 |

FOREIGN PATENT DOCUMENTS

CN          102164025 A     8/2011

OTHER PUBLICATIONS

State Intellectual Property Office, International Search Report and Written Opinion regarding International Patent Application No. PCT/CN2017/101374, dated Nov. 29, 2017.
Taiwan Intellectual Property Office, Office Action for Taiwan Patent Application No. 106131209, dated May 16, 2019.

* cited by examiner

*Primary Examiner* — Thien Nguyen
(74) *Attorney, Agent, or Firm* — Han IP PLLC; Andy M. Han

(57) ABSTRACT

Concepts and examples pertaining to combined coding design for efficient codeblock extension are described. A processor of a communication apparatus may combine channel polarization of a communication channel with a first coding scheme for first codeblocks of a smaller size to generate a second coding scheme. The processor may also code second codeblocks of a larger size using the second coding scheme.

20 Claims, 5 Drawing Sheets

500

COMBINE, BY A PROCESSOR, CHANNEL POLARIZATION OF A COMMUNICATION CHANNEL WITH A FIRST CODING SCHEME FOR FIRST CODEBLOCKS OF A SMALLER SIZE TO GENERATE A SECOND CODING SCHEME
510

CODE, BY THE PROCESSOR, SECOND CODEBLOCKS OF A LARGER SIZE USING THE SECOND CODING SCHEME
520

COMBINED CODING DESIGN FOR EFFICIENT CODEBLOCK EXTENSION

CROSS REFERENCE TO RELATED PATENT APPLICATION(S)

The present disclosure claims the priority benefit of U.S. Provisional Patent Application No. 62/393,262, filed 12 Sep. 2016, the content of which is incorporated by reference in its entirety.

TECHNICAL FIELD

The present disclosure is generally related to wireless communications and, more particularly, to combined coding design for efficient codeblock extension in communication systems.

BACKGROUND

Unless otherwise indicated herein, approaches described in this section are not prior art to the claims listed below and are not admitted as prior art by inclusion in this section.

In communication systems, communication channels are subject to channel noise and, thus, errors can be introduced during transmission from a source to a receiver of digital data. Accordingly, various error detection techniques as well as error correction techniques are often utilized to detect and correct errors to enable reliable delivery of digital data over unreliable communication channels. Polar codes are a type of error correction codes that are linear block error correcting codes. The construction of Polar codes is based on a multiple recursive concatenation of a short kernel code, which transforms the physical channel into virtual outer channels. As the number of recursions increases, the virtual channels tend to have either high reliability or low reliability (and hence are polarized, and data bits can be allocated to the most reliable channel(s) for reliable delivery of the data. In other words, channel polarization is an effective way to transform or polarize a communication channel into better and worse sub-channels. Moreover, by properly exploiting the better sub-channels, it is feasible to approach channel capacity of the communication channel.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

Under proposed schemes and concepts in accordance with the present disclosure, channel polarization and coding schemes that can effectively cover smaller codeblock sizes are combined. Advantageously, the combination generates a coding that can effectively cover larger codeblock sizes while realizing maximal reuse of smaller codeblock decoders at lower cost.

In one aspect, a method may involve a processor combining channel polarization of a communication channel with a first coding scheme for first codeblocks of a smaller size to generate a second coding scheme. The method may also involve the processor coding second codeblocks of a larger size using the second coding scheme.

In one aspect, an apparatus may include a processor. The processor may include a combining circuit and a coding circuit. The combining circuit may be capable of combining channel polarization of a communication channel with a first coding scheme for first codeblocks of a smaller size to generate a second coding scheme. The coding circuit may be capable of coding second codeblocks of a larger size using the second coding scheme.

It is noteworthy that, although description provided herein may be in the context of certain radio access technologies, networks and network topologies such as Wi-Fi, LTE, LTE-Advanced, LTE-Advanced Pro, $5^{th}$ Generation (5G), New Radio (NR) and Internet-of-Things (IoT), the proposed concepts, schemes and any variation(s)/derivative(s) thereof may be implemented in, for and by other types of radio access technologies, networks and network topologies. Moreover, although various examples described herein are in the context of wireless communications, the proposed concepts, schemes and any variation(s)/derivative(s) thereof may be applicable to communications via one or more wired mediums where suitable. Thus, the scope of the present disclosure is not limited to the examples described herein.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

In general, a large Polar code may be regarded as an inner polarization structure over "subcode" units, where each subcode may itself be a small Polar code. That is, a Polar code can be factored into multiple Polar subcodes with different code rates and connecting to an inner channel polarization structure. Selection of code rates may be based on the quality of the sub-channels and/or the total targeted data rate of per-channel usage. Under the proposed schemes in accordance with the present disclosure, by replacing the subcodes with another type of coding such as, for example and without limitation, turbo code, low-density parity-check (LDPC) code or tail-biting convolution code (TBCC), a large code (not Polar code) may be created. The large code may be capable of reusing subcode decoder(s) with additional simple successive cancellation decoding or successive cancellation list (SCL) decoding with a small list size over the inner polarization structure. Therefore, large codeword (Polar-like) performance may be achieved with subcode complexity. Reusing a smaller Polar decoder may be realized by sequentially decoding smaller Polar subcodes and perform Polar successive cancelation (SC) decoding on a per-subcode basis. Accordingly, memory/space complexity may be much reduced. As an example, for size-N successive cancellation list (SCL) decoding, the space complexity is $O(LN)$ with list size of L. For hybrid size-N/M SCL and size-M SC decoding, the space complexity is $O(LN/M+N)$. In this example, space complexity can be reduced to less than 40% for L=8 and M=4, and to less than 25% for L=8 and M=8. Similarly, computation/time complexity may also be reduced.

Figure 1:
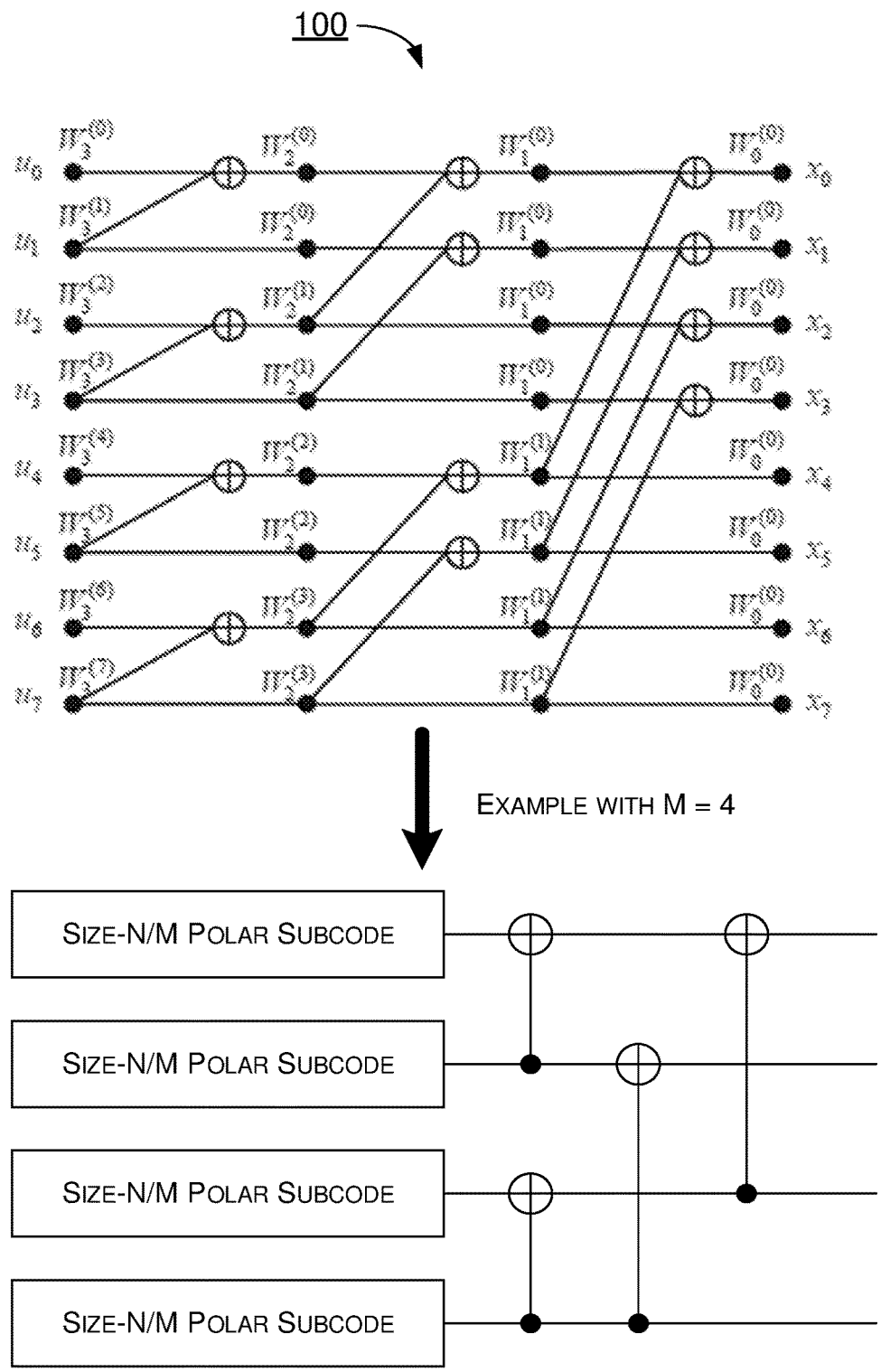
FIG. 1 is a diagram of an example design in accordance with an implementation of the present disclosure.

FIG. 1 illustrates an example design 100 with M=4 in accordance with an implementation of the present disclosure. Example design 100 is an illustrative and non-limiting example of combined coding for efficient codeblock extension. The size-N/M subcodes shown in FIG. 1 may be Polar subcodes or other types of subcodes (e.g., turbo code, LDPC code or TBCC). Example design 100 combines channel polarization and coding scheme(s) (e.g., Polar code, turbo code, LDPC code and/or TBCC), which can effectively cover smaller codeblock sizes, to generate a coding that can effectively cover larger codeblock sizes while realizing maximal reuse of the smaller codeblock decoder(s) at relatively smaller cost. For instance, in the example shown in FIG. 1, for hybrid size-N/M SCL and size-M SC decoding, the space complexity can be reduced from $O(LN)$ to $O(LN/M+N)$.

For Polar code, per-subcode cyclic redundancy check (CRC) or any other scheme that can help subcode decoding performance may be added on a per-subcode basis. When CRC-aided SCL decoding is used, local CRCs for the subcodes may be added. In some cases, specially designed mapping may be introduced before mapping to subcode input. The mechanism may also be added on a per-subcode basis. Addition on a per-subcode basis is a tradeoff regarding overhead.

Figure 2:
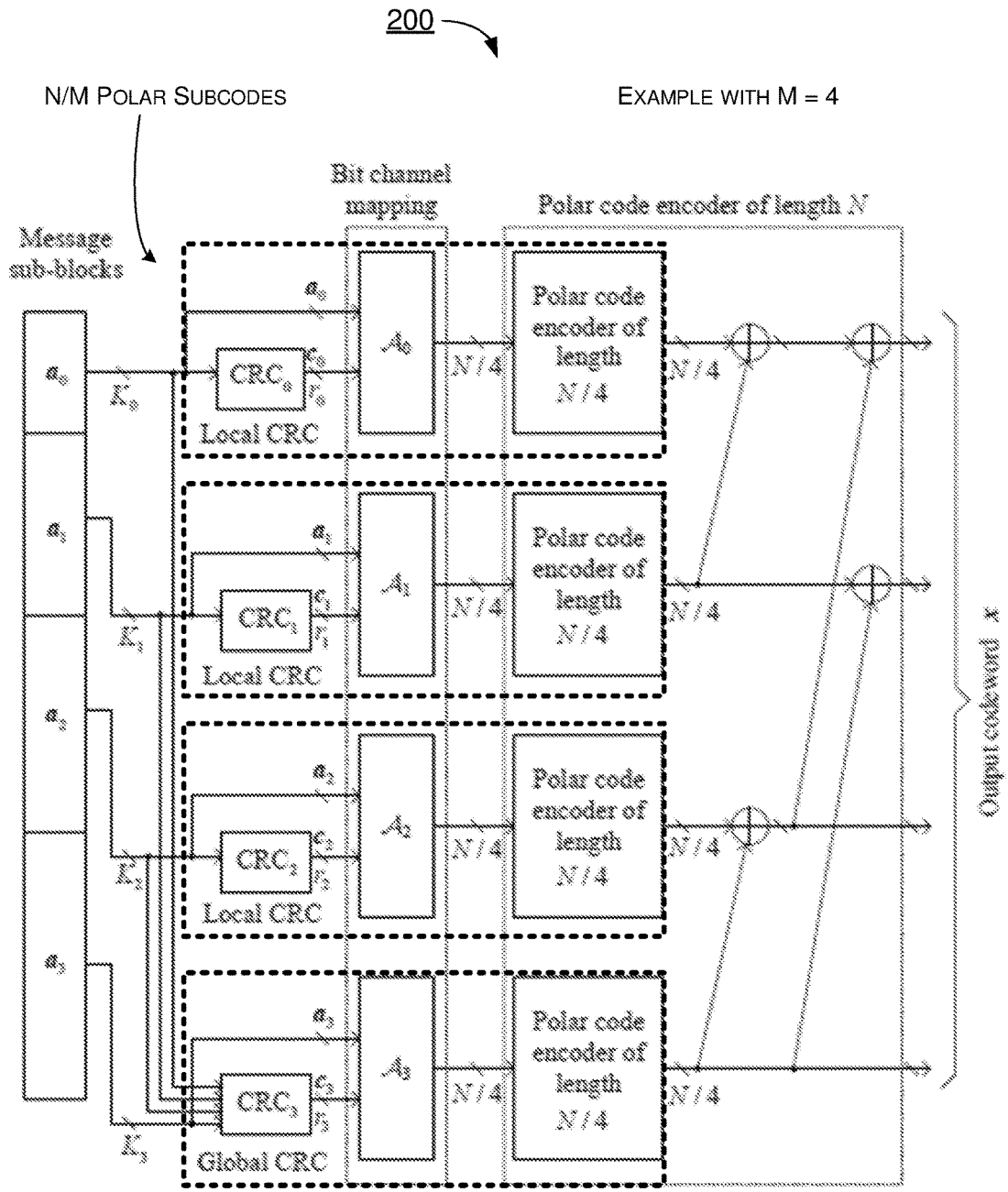
FIG. 2 is a diagram of an example design in accordance with an implementation of the present disclosure.

In addition to per-subcode performance assistance, the proposed schemes in accordance with the present disclosure may add a global check to confirm the correctness of all information bits and/or message bits distributed to multiple sub-codes. FIG. 2 illustrates an example design 200 with M=4 in accordance with an implementation of the present disclosure. In example 200, the local CRC of the last subcode can be extended to check the validity of an entire message. There may be additional check/CRC over the entire message. In the example shown in FIG. 2, for Polar code with N/M Polar subcode, subcode-wise decoding show only small loss with respect to whole codeword decoding.

Figure 3:
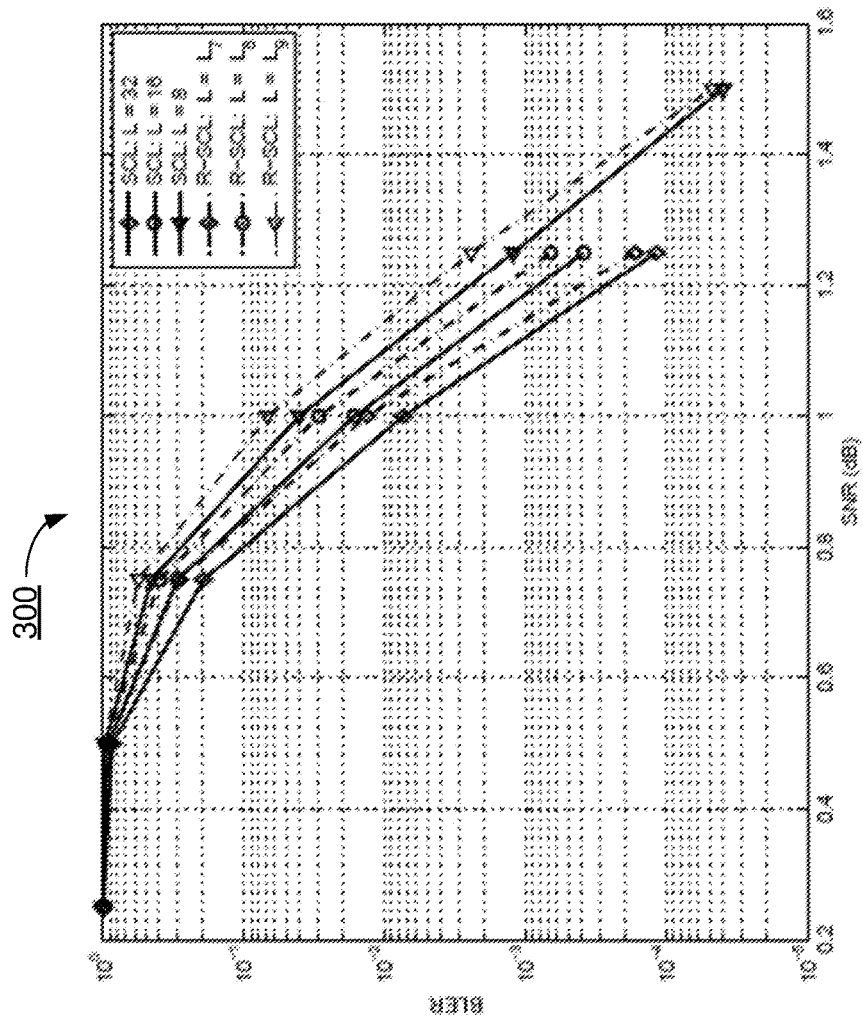
FIG. 3 is an example chart of performance in a simulation in accordance with an implementation of the present disclosure.

FIG. 3 is an example chart 300 of performance in a simulation in accordance with an implementation of the present disclosure. In the simulation, N=16384, M=8 (with subcode size of 2048), code rate=0.5, and per-subcode 10-bit CRC is performed with the last one also used as a global CRC. In terms of results, performance loss is up to 0.02 dB with respect to SCL decoding over a size N of 16384. Additionally, memory/space complexity is reduced to less than 25% in the simulation. Moreover, there is about 20% reduction in computation/time complexity.

Under the proposed schemes, while each subcode may be a Polar code, in general a subcode may be another type of subcode such as, for example and without limitation, turbo code, LDPC code, TBCC or the like. By combining a subcode type with the channel polarization structure of size M, the subcode may be extended to cover up to M times of codeblock size with enhanced performance. For instance, this may be achieved by proper selection of per-subcode code rate. Alternatively or additionally, this may be achieved by SC decoding or SCL decoding with a small size to exploit the channel polarization structure. Advantageously, as a subcode decoder may be reused to decode a large code in a sequential manner, the overall decoder complexity to decode the large code may be kept around the same order as that of a small subcode decoder.

Under the proposed schemes, information bits and/or message bits may be properly allocated into each subcode according to the sub-channel quality after channel polarization. In some implementations, in a low-complexity realization, the good-bit selection scheme for Polar code may be reused. As an example, considering a size-N Polar code with targeted information bit number i, the good bit indices may be selected according to Polar code rate-matching design. Proper information bit number may be loaded into i-th subcode (with $0 \le i \le M-1$) according to the number of good bit indices lying in the range i N/M to $(i+1)N/(M-1)$. Then, each subcode may apply rate matching with respect to the assigned information bit number and code bit number N/M.

Accordingly, the proposed schemes in accordance with the present disclosure may be implemented to allow a control channel decoder, which can effectively decode small control messages, to decode a larger data message encoded by the combined structure according to the present disclosure. Moreover, the proposed schemes in accordance with the present disclosure may be implemented to extend a data coding design of a specified moderate codeblock size to a larger codeblock size to provide the capability of stronger protection over a wider resource span in terms of time, frequency and/or space. Furthermore, the proposed schemes in accordance with the present disclosure may be implemented to combine retransmitted codeblock(s) as first sub-codeblock(s) and combine new data codeblock(s) as later sub-codeblock(s) so as to apply higher code rate(s) in new data codeblock(s) by exploiting channel polarization gain.

Under the proposed schemes, Polar code may be adapted to various output code bit length with much reduced complexity. Accordingly, the present disclosure provides a generic procedure to incorporate any suitable low-complexity rate matching designs. The following is a description of encoding design and decoding design in accordance with the present disclosure.

With respect to encoding design, the procedure in accordance with the present disclosure may involve a number of operations. Firstly, a Polar code may be constructed based on required information bit length K and code rate R. The number of code bit N and the punctured coded bit P may be determined by the following expressions:

$$N=2^n, n=\text{ceil}(\log_2(K/R))$$

$$P=N-K/R$$

The procedure may involve determining the punctured bitmap of size N. Here, value 1 may indicate puncture of the corresponding bit position and value 0 may denote no puncturing. The procedure may also involve determining the frozen bitmap of size N. Here, value 1 may indicate frozen of the input value of the corresponding bit position to Polar encoder, and value 0 may indicate a variable input bit value that can be used to carry one information bit. The punctured bits may also be frozen bits.

Secondly, the Polar code of size N may be partitioned into N subcodes. The size of N may be adjusted according to targeted subcode decoder complexity. The number B of subcodes may be determined by the following expression:

$$B=\min(1, N/Ns)$$

Thirdly, the proper CRC size with each subcode may be determined according to the following expression, with $C_i$ denoting the CRC size in subcode i subject to a predefined set $S=\{s_0, s_1, \ldots s_{k-1}\}$:

$$C_i=\min[\min(F_i-P_i, K_i/M), \max(s_k)], s_k \in S$$

Here, $K_i$ is the number of information bits in the subcode i. $F_i$ is the number of frozen bits in the subcode i. $P_i$ is the number of punctured bits in the subcode i. M is the parameter used to keep sufficient number of information bit for CRC encoding and may be properly designed. In some implementations, the value of K may be set to 8. The set S may be designed to include available or preferred CRC size(s). In some implementations, $S=\{0, 2, 4, 8\}$.

Fourthly, CRC bit insertion may be performed. The punctured bitmap obtained during construction of the Polar code may not be modified. Thus, the code rate R may not be changed by additional CRC bit insertion. The procedure may involve determining a new frozen bitmap with number of information bit=K+sum of $C_i$ with i varying from 1 to B. The procedure may also involve inserting CRC bits into unfrozen bit with lower index in each subcode.

With respect to decoding design, the procedure in accordance with the present disclosure may involve a number of operations. For each subcode, decoding may reuse a SCL decoder with a targeted list size L. CRC may be performed at the end of subcode during list decoding if $C_i \neq 0$. The subcode CRC may be used to down-select the information paths passing the CRC check with the L' best path metrics. In some implementations, decoder complexity reduction may be prioritized with L'=1. After finishing decoding a subcode, the decoder may perform a subcode-wise SCL decoding of list L' so as to acquire the input to a next subcode given its lower indexed subcode decoding result(s).

It is noteworthy that Polar code rate-matching design may be considered. According to the mother code rate of Polar code of size N before rate-matching, some channel output soft values may be set to 0 or a value of large magnitude corresponding to known bit sign. Accordingly, multi-CRC aided Polar decoding may be used to decode a Polar code with rate matching and multiple CRC insertions.

In view of the above, it may be appreciated by those with ordinary skill in the art that there may be numerous possible applications of the proposed schemes, such as in 5G/NR wireless communication networks. An example application may be Ultra-Reliable Low Latency Communications (URLLC) data by Polar coding in 5G/NR networks. In this application, control Polar decoder may apply list-decoding for Polar size of N≤512. A larger Polar code may be required to cover data of size greater than 512. To allow reusing of small Polar decoder, a large Polar code may be factored into size-512 Polar subcodes with insertion of per-subcode CRC to enable reusing of small Polar decoder for each subcode.

Another example application of the proposed schemes may be URLLC data by LDPC coding. In this application, data channel of URLLC may utilize enhanced Mobile Broadband (eMBB) data channel coding such as LDPC, for example. The lowest code rates may be ⅓ or ⅕. Without redesigning LDPC, the polarized LDPC design may have the potential to provide even lower code rates. Since Polar code has no error floor, the polarized LDPC may also have the potential to improve the error floor performance of existing LDPC.

A further example application of the proposed schemes may be enhanced Machine Type Communications (eMTC). In this application, Narrowband Internet of Things (NB-IoT) utilizing TBCC may be considered for 5G/NR eMTC. TBCC is simple, yet its performance for codeblock size greater than 100 bits is inferior to Polar and LDPC. Applying the proposed coding combination and extension scheme with TBCC and inner polarization structure, data channel performance can be improved while keeping low cost benefit of TBCC.

Illustrative Implementations

Figure 4:
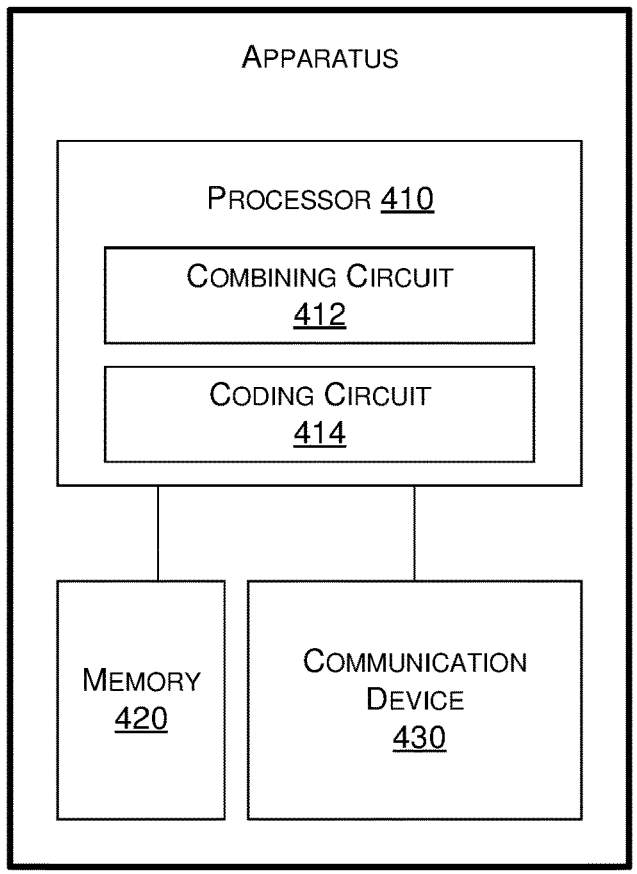
FIG. 4 is a block diagram of an example apparatus in accordance with an implementation of the present disclosure.

FIG. 4 illustrates an example apparatus 400 in accordance with an implementation of the present disclosure. Apparatus 400 may perform various functions to implement schemes, techniques, processes and methods described herein pertaining to combined coding design for efficient codeblock extension in communication systems, including designs 100 and 200 described above as well as process 500 described below.

Apparatus 400 may be a part of an electronic apparatus, which may be a portable or mobile apparatus, a wearable apparatus, a wireless communication apparatus or a computing apparatus. For instance, apparatus 400 may be implemented in a smartphone, a smartwatch, a personal digital assistant, a digital camera, or a computing equipment such as a tablet computer, a laptop computer or a notebook computer. In the context of a communications system, apparatus 400 may be implemented in or as part of a user equipment (UE) or a base station (e.g., eNB, gNB or transmit-and-receive point (TRP)). In some implementations, apparatus 400 may be a part of a machine type apparatus, which may be an IoT apparatus such as an immobile or a stationary apparatus, a home apparatus, a wire communication apparatus or a computing apparatus. For instance, apparatus 400 may be implemented in a smart thermostat, a smart fridge, a smart door lock, a wireless speaker or a home control center. Alternatively, apparatus 400 may be implemented in the form of one or more integrated-circuit (IC) chips such as, for example and without limitation, one or more single-core processors, one or more multi-core processors, or one or more complex-instruction-set-computing (CISC) processors. Apparatus 400 may include at least some of those components shown in FIG. 4 such as a processor 410, for example. Apparatus 400 may further include one or more other components not pertinent to the proposed scheme of the present disclosure (e.g., internal power supply, display device and/or user interface device). Such component(s) of apparatus 400 are neither shown in FIG. 4 nor described below in the interest of simplicity and brevity.

In one aspect, processor 410 may be implemented in the form of one or more single-core processors, one or more multi-core processors, or one or more CISC processors. That is, even though a singular term "a processor" is used herein to refer to processor 410, processor 410 may include multiple processors in some implementations and a single processor in other implementations in accordance with the present disclosure. In another aspect, processor 410 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, processor 410 is a special-purpose machine specifically designed, arranged and configured to perform specific tasks including those pertaining to combined coding design for efficient codeblock extension in accordance with various implementations of the present disclosure.

In some implementations, apparatus 400 may also include a communication device 430 coupled to processor 410. Communication device 430 may include a transceiver capable of transmitting and receiving data wirelessly and/or via one or more wired mediums.

In some implementations, apparatus 400 may further include a memory 420 coupled to processor 410 and capable of being accessed by processor 410 and storing data therein. Memory 420 may include a type of random-access memory (RAM) such as dynamic RAM (DRAM), static RAM (SRAM), thyristor RAM (T-RAM) and/or zero-capacitor RAM (Z-RAM). Alternatively or additionally, memory 420 may include a type of read-only memory (ROM) such as mask ROM, programmable ROM (PROM), erasable programmable ROM (EPROM) and/or electrically erasable programmable ROM (EEPROM). Alternatively or additionally, memory 420 may include a type of non-volatile random-access memory (NVRAM) such as flash memory, solid-state memory, ferroelectric RAM (FeRAM), magnetoresistive RAM (MRAM) and/or phase-change memory.

In some implementations, processor 410 may include a combining circuit 412 and a coding circuit 414. Combining circuit 412 may be capable of combining channel polarization of a communication channel with a first coding scheme for first codeblocks of a smaller size to generate a second coding scheme. Coding circuit 414 may be capable of coding second codeblocks of a larger size using the second coding scheme.

In some implementations, the first coding scheme may utilize one or more smaller codeblock decoders configured to decode the first codeblocks of the smaller size. Accordingly, in coding the second codeblocks of the larger size using the second coding scheme, coding circuit 414 may decode the second codeblocks of the larger size by reusing the one or more smaller codeblock decoders of the first coding scheme.

In some implementations, in decoding the second codeblocks of the larger size by reusing the one or more smaller codeblock decoders, coding circuit 414 may decode the second codeblocks of the larger size by reusing one or more smaller Polar decoders.

In some implementations, in combining the channel polarization and the first coding scheme, combining circuit 412 may factor a large code into a plurality of subcodes with different code rates and connected to an inner channel polarization structure.

In some implementations, in factoring the large code into the plurality of subcodes with different code rates, combining circuit 412 may select the different code rates based on a quality of one or more sub-channels of the communication channel as a result of the channel polarization. Alternatively or additionally, in factoring the large code into the plurality of subcodes with different code rates, combining circuit 412 may select the different code rates based on a total targeted data rate of per-channel usage.

In some implementations, in factoring the large code into the plurality of subcodes, combining circuit 412 may allocate the large code into a plurality of Polar subcodes, a plurality of turbo codes, a plurality of low-density parity-check (LDPC) codes, or a plurality of tail-biting convolution codes (TBCCs).

In some implementations, in decoding the second codeblocks of the larger size using the second coding scheme, coding circuit 414 may sequentially decode the plurality of subcodes. Additionally, coding circuit 414 may perform successive cancellation (SC) decoding or successive cancellation list (SCL) decoding with a small list size on a per-subcode basis.

In some implementations, in decoding the second codeblocks of the larger size using the second coding scheme, coding circuit 414 may also perform cyclic redundancy check (CRC) on a per-subcode basis. Moreover, coding circuit 414 may perform a global check for correctness of a plurality of bits distributed into the plurality of subcodes.

In some implementations, the plurality of subcodes may include a plurality of Polar subcodes. Accordingly, in decoding the second codeblocks of the larger size using the second coding scheme, coding circuit 414 may sequentially decode the plurality of Polar subcodes. Moreover, coding circuit 414 may perform Polar SC decoding or SCL decoding with a small list size on a per-subcode basis.

Figure 5:
FIG. 5 is a flowchart of an example process in accordance with an implementation of the present disclosure.

FIG. 5 illustrates an example process 500 in accordance with an implementation of the present disclosure. Process 500 may represent an aspect of implementing the proposed concepts and schemes such as one or more of the various schemes described above with respect to designs 100 and 200 as well as apparatus 400. More specifically, process 500 may represent an aspect of the proposed concepts and schemes pertaining to combined coding design for efficient codeblock extension in communication systems. For instance, process 500 may be an example implementation, whether partially or completely, of the proposed scheme described above for combined coding design for efficient codeblock extension in communication systems. Process 500 may include one or more operations, actions, or functions as illustrated by one or more of blocks 510 and 520. Although illustrated as discrete blocks, various blocks of process 500 may be divided into additional blocks, combined into fewer blocks, or eliminated, depending on the desired implementation. Moreover, the blocks/sub-blocks of process 500 may be executed in the order shown in FIG. 5 or, alternatively in a different order. The blocks/sub-blocks of process 500 may be executed iteratively. Process 500 may be implemented by or in apparatus 400 as well as any variations thereof. Solely for illustrative purposes and without limiting the scope, process 500 is described below in the context of apparatus 400 implemented as a communication apparatus (e.g., a UE such as a smartphone). Process 500 may begin at block 510.

At 510, process 500 may involve processor 410 of apparatus 400 combining channel polarization of a communication channel with a first coding scheme for first codeblocks of a smaller size to generate a second coding scheme. Process 500 may proceed from 510 to 520.

At 520, process 500 may involve processor 410 coding second codeblocks of a larger size using the second coding scheme.

In some implementations, the first coding scheme may utilize one or more smaller codeblock decoders configured to decode the first codeblocks of the smaller size. Accordingly, in coding the second codeblocks of the larger size using the second coding scheme, process 500 may involve processor 410 decoding the second codeblocks of the larger size by reusing the one or more smaller codeblock decoders of the first coding scheme.

In some implementations, in decoding the second codeblocks of the larger size by reusing the one or more smaller codeblock decoders, process 500 may involve processor 410 decoding the second codeblocks of the larger size by reusing one or more smaller Polar decoders.

In some implementations, in combining the channel polarization of the communication channel with the first coding scheme, process 500 may involve processor 410 factoring a large code into a plurality of subcodes with different code rates and connected to an inner channel polarization structure.

In some implementations, in factoring the large code into the plurality of subcodes with different code rates, process 500 may involve processor 410 selecting the different code rates based on a quality of one or more sub-channels of the communication channel as a result of the channel polarization. Alternatively or additionally, in factoring the large code into the plurality of subcodes with different code rates, process 500 may involve processor 410 selecting the different code rates based on a total targeted data rate of per-channel usage.

In some implementations, in factoring the large code into the plurality of subcodes, process 500 may involve processor 410 allocating the large code into a plurality of Polar subcodes, a plurality of turbo codes, a plurality of LDPC codes, or a plurality of TBCCs.

In some implementations, in decoding the second codeblocks of the larger size using the second coding scheme, process 500 may involve processor 410 sequentially decoding the plurality of subcodes. Additionally, process 500 may involve processor 410 performing SC decoding or SCL decoding with a small list size on a per-subcode basis.

In some implementations, in decoding the second codeblocks of the larger size using the second coding scheme, process 500 may involve processor 410 performing additional operations. For instance, process 500 may involve processor 410 performing CRC on a per-subcode basis. Moreover, process 500 may involve processor 410 performing a local check for correctness of a plurality of bits distributed into the plurality of subcodes.

In some implementations, the plurality of subcodes may include a plurality of Polar subcodes. Accordingly, in decoding the second codeblocks of the larger size using the second coding scheme, process 500 may involve processor 410 sequentially decoding the plurality of Polar subcodes. Furthermore, process 500 may involve processor 410 performing Polar SC decoding or SCL decoding with a small list size on a per-subcode basis.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
   combining, by a combining circuit of a processor of an apparatus, channel polarization of a communication channel with a first coding scheme for first codeblocks of a smaller size to generate a second coding scheme; and
   coding, by a coding circuit of the processor, second codeblocks of a larger size using the second coding scheme;
   wherein the combining circuit comprises:
      a plurality of subcoders;
      a plurality of mapping circuits each coupled to an input of a respective one of the plurality of subcoders; and
      a plurality of cyclic redundancy check (CRC) circuits each coupled to an input of to a respective one of the plurality of mapping circuits,
   wherein, during operation:
      each sub-block of a plurality of sub-blocks of a message to be coded is provided to a respective one of the plurality of CRC circuits, and
      an output of each of the plurality of subcoders is added to an output of each of one or more other subcoders of the plurality of subcoders, and
   wherein the combining of the channel polarization of the communication channel with the first coding scheme comprises the combining circuit performing operations comprising:
      factoring a large code into a plurality of subcodes with different code rates corresponding to the plurality of subcoders;
      adding the plurality of subcodes on a per-subcode basis; and
      inserting a respective CRC for each subcode of the plurality of subcodes.

2. The method of claim 1, wherein the first coding scheme utilizes a codeblock decoder configured to decode the first codeblocks of the smaller size, and wherein the coding of the second codeblocks of the larger size using the second coding scheme comprises decoding the second codeblocks of the larger size by reusing the codeblock decoder of the first coding scheme.

3. The method of claim 2, wherein the decoding of the second codeblocks of the larger size by reusing the codeblock decoder comprises decoding the second codeblocks of the larger size by:
   sequentially decoding a plurality of Polar subcodes; and
   performing Polar successive cancelation (SC) decoding on a per-subcode basis.

4. The method of claim 1, wherein the combining of the channel polarization of the communication channel with the first coding scheme further comprises extending a local CRC of a last subcode of the plurality of subcodes to check validity of an entire message that is being encoded.

5. The method of claim 1, wherein the factoring of the large code into the plurality of subcodes with different code rates comprises selecting the different code rates based on a quality of one or more sub-channels of the communication channel as a result of the channel polarization.

6. The method of claim 1, wherein the factoring of the large code into the plurality of subcodes with different code rates comprises selecting the different code rates based on a total targeted data rate of per-channel usage.

7. The method of claim 1, wherein the factoring of the large code into the plurality of subcodes comprises allocating the large code into a plurality of Polar subcodes, a plurality of turbo codes, a plurality of low-density parity-check (LDPC) codes, or a plurality of tail-biting convolution codes (TBCCs).

8. The method of claim 2, wherein the decoding of the second codeblocks of the larger size using the second coding scheme comprises:
   sequentially decoding the plurality of subcodes; and
   performing successive cancellation (SC) decoding or successive cancellation list (SCL) decoding with a small list size on a per-subcode basis.

9. The method of claim 8, wherein the decoding of the second codeblocks of the larger size using the second coding scheme further comprises:
   performing cyclic redundancy check (CRC) on a per-subcode basis; and
   performing a global check for correctness of a plurality of bits distributed into the plurality of subcodes.

10. The method of claim 4, wherein the plurality of subcodes comprises a plurality of Polar subcodes, and wherein the decoding of the second codeblocks of the larger size using the second coding scheme comprises:
    sequentially decoding the plurality of Polar subcodes; and
    performing Polar successive cancellation (SC) decoding or successive cancellation list (SCL) decoding with a small list size on a per-subcode basis.

11. An apparatus, comprising:
    a processor comprising:
       a combining circuit capable of combining channel polarization of a communication channel with a first coding scheme for first codeblocks of a smaller size to generate a second coding scheme; and
       a coding circuit capable of coding second codeblocks of a larger size using the second coding scheme,
    wherein the combining circuit comprises:
       a plurality of subcoders;
       a plurality of mapping circuits each coupled to an input of a respective one of the plurality of subcoders; and
       a plurality of cyclic redundancy check (CRC) circuits each coupled to an input of to a respective one of the plurality of mapping circuits,
    wherein, during operation:
       each sub-block of a plurality of sub-blocks of a message to be coded is provided to a respective one of the plurality of CRC circuits, and
       an output of each of the plurality of subcoders is added to an output of each of one or more other subcoders of the plurality of subcoders, and wherein, in combining the channel polarization of the communication channel with the first coding scheme, the combining circuit performs operations comprising:

factoring a large code into a plurality of subcodes with different code rates corresponding to the plurality of subcoders;

adding the plurality of subcodes on a per-subcode basis; and inserting a respective CRC for each subcode of the plurality of subcodes.

12. The apparatus of claim 11, wherein the first coding scheme utilizes a codeblock decoder configured to decode the first codeblocks of the smaller size, and wherein, in coding the second codeblocks of the larger size using the second coding scheme, the coding circuit decodes the second codeblocks of the larger size by reusing the codeblock decoder of the first coding scheme.

13. The apparatus of claim 12, wherein, in decoding the second codeblocks of the larger size by reusing the codeblock decoder, the coding circuit decodes the second codeblocks of the larger size by:

sequentially decoding a plurality of Polar subcodes; and performing Polar successive cancelation (SC) decoding on a per-subcode basis.

14. The apparatus of claim 11, wherein, in combining the channel polarization and the first coding scheme, the combining circuit further extends a local CRC of a last subcode of the plurality of subcodes to check validity of an entire message that is being encoded.

15. The apparatus of claim 11, wherein, in factoring the large code into the plurality of subcodes with different code rates, the combining circuit selects the different code rates based on a quality of one or more sub-channels of the communication channel as a result of the channel polarization.

16. The apparatus of claim 11, wherein, in factoring the large code into the plurality of subcodes with different code rates, the combining circuit selects the different code rates based on a total targeted data rate of per-channel usage.

17. The apparatus of claim 11, wherein, in factoring the large code into the plurality of subcodes, the combining circuit allocates the large code into a plurality of Polar subcodes, a plurality of turbo codes, a plurality of low-density parity-check (LDPC) codes, or a plurality of tail-biting convolution codes (TBCCs).

18. The apparatus of claim 12, wherein, in decoding the second codeblocks of the larger size using the second coding scheme, the coding circuit performs operations comprising:

sequentially decoding the plurality of subcodes; and performing successive cancellation (SC) decoding or successive cancellation list (SCL) decoding with a small list size on a per-subcode basis.

19. The apparatus of claim 18, wherein, in decoding the second codeblocks of the larger size using the second coding scheme, the coding circuit further performs operations comprising:

performing cyclic redundancy check (CRC) on a per-subcode basis; and performing a local check for correctness of a plurality of bits distributed into the plurality of subcodes.

20. The apparatus of claim 14, wherein the plurality of subcodes comprises a plurality of Polar subcodes, and wherein, in decoding the second codeblocks of the larger size using the second coding scheme, the coding circuit performs operations comprising:

sequentially decoding the plurality of Polar subcodes; and performing Polar successive cancellation (SC) decoding or successive cancellation list (SCL) decoding with a small list size on a per-subcode basis.

* * * * *